US012451576B2

(12) United States Patent
Tainaka et al.

(10) Patent No.: US 12,451,576 B2
(45) Date of Patent: Oct. 21, 2025

(54) DOUBLE-SIDED BOARD, RADAR APPARATUS, TRANSMISSION MEMBER, AND METHOD OF MANUFACTURING TRANSMISSION MEMBER (71) Applicant: DENSO CORPORATION, Kariya (JP)

(72) Inventors: Yusuke Tainaka, Kariya (JP); Kazuhiro Aoki, Kariya (JP); Kenji Goto, Kariya (JP)

(73) Assignee: DENSO CORPORATION, Kariya (JP)

( * ) Notice: Subject to any disclaimer, the term of this patent is extended or adjusted under 35 U.S.C. 154(b) by 408 days.

(21) Appl. No.: 17/929,241

(22) Filed: Sep. 1, 2022

(65) Prior Publication Data
US 2022/0416394 A1 Dec. 29, 2022

Related U.S. Application Data (63) Continuation of application No. PCT/JP2021/008336, filed on Mar. 4, 2021.

(30) Foreign Application Priority Data

Mar. 6, 2020 (JP) .................. 2020-038397

(51) Int. Cl.
H01P 3/16 (2006.01)
G01S 7/03 (2006.01)
G01S 13/931 (2020.01)

(52) U.S. Cl.
CPC .............. H01P 3/16 (2013.01); G01S 7/032 (2013.01); G01S 13/931 (2013.01)

(58) Field of Classification Search
CPC .. H01P 3/16; H01P 1/047; H01P 5/087; H01P 1/042; H01P 1/162; H01P 3/121;
(Continued)

(56) References Cited

U.S. PATENT DOCUMENTS 3,182,272 A * 5/1965 Borghetti ................ H01P 5/103
333/252
6,906,674 B2 * 6/2005 McKinzie, III ...... H01Q 15/008
343/700 MS
(Continued)

FOREIGN PATENT DOCUMENTS

JP 2005012699 A 1/2005
JP 2010028345 A 2/2010
(Continued)

OTHER PUBLICATIONS

Li, Wu-Bin et al. âA Waveguide Overloaded Cavity Kicker for the HLS II Longitudinal Feedback System.â Chinese physics C 38.3 (2014): 37003-. Web. (Year: 2014).*

Primary Examiner — Vladimir Magloire
Assistant Examiner — Remash R Guyah
(74) Attorney, Agent, or Firm — Maschoff Brennan (57) ABSTRACT A double-sided board includes a first-type conductor layer, a second-type conductor layer, a waveguide-filled dielectric layer and a waveguide. The waveguide-filled dielectric layer is a dielectric layer provided between the first-type conductor layer and the second-type conductor layer. The waveguide is provided in such a manner as to penetrate the waveguide-filled dielectric layer in a direction from one of the first-type conductor layer and the second-type conductor layer to the other of the two conductor layers. A cross section of the waveguide in a plane parallel to the first-type conductor layer has a longitudinal direction and a lateral direction perpendicular to the longitudinal direction. The cross section of the waveguide has, along the longitudinal direction, a central part and two end parts located respectively on two sides of the central part. A lateral length of each of the end parts is larger than a lateral length of the central part.

15 Claims, 8 Drawing Sheets (58) Field of Classification Search
CPC .. H01P 5/024; H01P 5/08; H01P 5/107; H01P 3/088; G01S 7/032; G01S 13/931; G01S 7/03; H01Q 1/3233; H01Q 21/0075; H01Q 13/00; H01Q 21/0087; H05K 1/02; H05K 1/0251; H05K 1/115; H05K 2201/09609; H05K 1/0222; H05K 1/111; H05K 2201/096; H05K 3/46
USPC .............. 342/70; 333/239; 343/700 MS; 174/250; 29/600
See application file for complete search history.

(56) References Cited

U.S. PATENT DOCUMENTS

| | | | |
|---|---|---|---|
| 9,819,067 B2 * | 11/2017 | Yang | H01P 5/08 |
| 10,680,305 B2 * | 6/2020 | Foroozesh | H01P 5/024 |
| 11,495,871 B2 * | 11/2022 | Vosoogh | H01P 3/12 |
| 2003/0011522 A1 * | 1/2003 | McKinzie, III | H01Q 15/008 343/700 MS |
| 2015/0325908 A1 | 11/2015 | Reuter | |
| 2016/0240908 A1 | 8/2016 | Strong et al. | |
| 2019/0244921 A1 * | 8/2019 | Kuo | H01L 25/0657 |
| 2020/0028228 A1 * | 1/2020 | Yoshioka | H01P 5/087 |
| 2020/0045810 A1 * | 2/2020 | Sakurai | H05K 1/0222 |
| 2021/0013573 A1 * | 1/2021 | Aoki | H01P 3/088 |

FOREIGN PATENT DOCUMENTS

| | | |
|---|---|---|
| JP | 2015089091 A | 5/2015 |
| WO | 2017/170377 A1 | 5/2017 |

* cited by examiner

$Ln1e < \dfrac{L1}{3}$

DOUBLE-SIDED BOARD, RADAR APPARATUS, TRANSMISSION MEMBER, AND METHOD OF MANUFACTURING TRANSMISSION MEMBER

CROSS-REFERENCE TO RELATED APPLICATIONS

The present application is a continuation application of International Application No. PCT/JP2021/008336 filed on Mar. 4, 2021, which is based on and claims priority from Japanese Patent Application No. 2020-038397 filed on Mar. 6, 2020. The entire contents of these applications are incorporated by reference into the present application.

BACKGROUND

1 Technical Field

The present disclosure relates to double-sided boards, radar apparatuses, transmission members, and methods of manufacturing the transmission members.

2 Description of Related Art

There is disclosed, for example in Japanese Patent Application Publication No. JP 2019-180020 A, a double-sided board that is configured to transmit signals from one of two surfaces of the double-sided board to the other of the two surfaces through a waveguide having a substantially rectangular cross section.

SUMMARY

For reducing the loss when transmitting a signal using a waveguide, it is necessary to increase the length of the waveguide in a longitudinal direction thereof to some extent. However, the increased length of the waveguide may become a constraint on reduction of the size of the double-sided board.

The present disclosure has been accomplished in view of the above problem.

According to the present disclosure, there is provided a double-sided board which includes a first-type conductor layer, a second-type conductor layer, a waveguide-filled dielectric layer and a waveguide. The waveguide-filled dielectric layer is a dielectric layer provided between the first-type conductor layer and the second-type conductor layer. The waveguide is provided in such a manner as to penetrate the waveguide-filled dielectric layer in a direction from one of the first-type conductor layer and the second-type conductor layer to the other of the first-type conductor layer and the second-type conductor layer. A cross section of the waveguide in a plane parallel to the first-type conductor layer has a longitudinal direction and a lateral direction perpendicular to the longitudinal direction. The cross section of the waveguide has, along the longitudinal direction, a central part and two end parts located respectively on two sides of the central part. A lateral length of each of the end parts is larger than a lateral length of the central part.

The frequency at which the transmission loss of the waveguide becomes small tends to decrease with increase in the longitudinal length of the waveguide. In this regard, with the above configuration, the cross section of the waveguide is shaped so that the lateral length of each of the longitudinal end parts is larger than the lateral length of the longitudinal central part. Consequently, for the same longitudinal length of the waveguide, the frequency at which the transmission loss becomes small can be lowered as compared with the case of setting the lateral length of each of the longitudinal end parts to be equal to the lateral length of the longitudinal central part. Hence, with the above configuration, it becomes possible to reduce the longitudinal length of the waveguide as compared with the case of setting the lateral length of each of the longitudinal end parts to be equal to the lateral length of the longitudinal central part. As a result, it becomes possible to suitably achieve both reduction in the size of the double-sided board and reduction in the loss when transmitting a signal using the waveguide.

DESCRIPTION OF EMBODIMENTS

Hereinafter, an embodiment of a double-sided board will be described with reference to the drawings.

Figure 1:
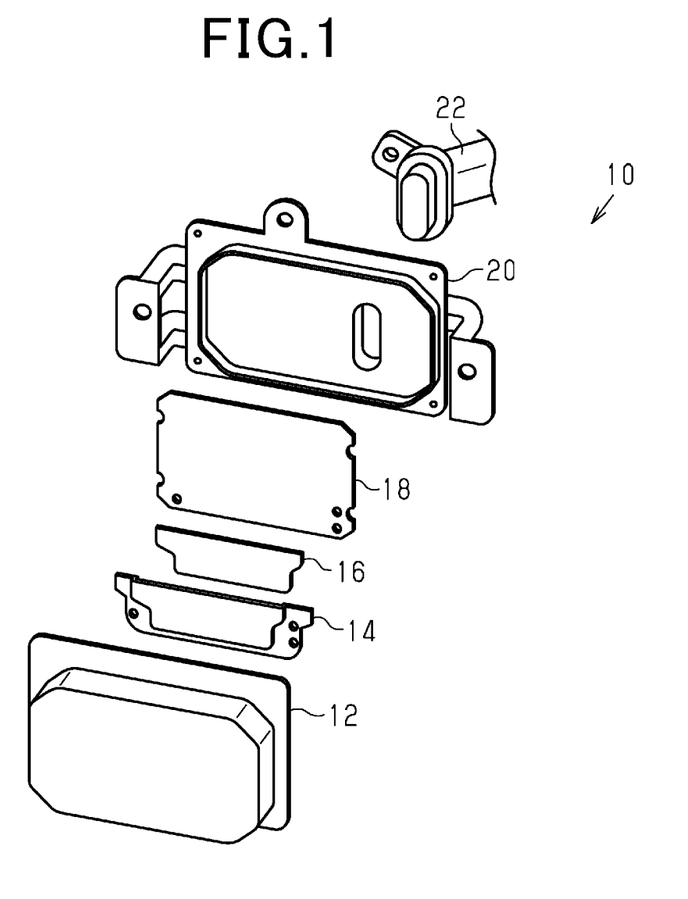
FIG. 1 is an exploded perspective view illustrating the configuration of a radar apparatus according to an embodiment.

FIG. 1 illustrates the configuration of a radar apparatus 10 according to the present embodiment. The radar apparatus 10 is an apparatus where: a shield plate 14, a radio wave absorber 16 and a double-sided board 18 are received in a space defined by a radome 12 and a lower case 20; and a connector 22 is mounted to the lower case 20. The shield plate 14 is a metal plate for suppressing intrusion of unnecessary external noise radio-waves on the double-sided board 18. The radio wave absorber 16 is a member for absorbing electromagnetic waves in order to suppress irregular reflection of radio waves at that part of the double-sided board 18 which is covered by the shield plate 14.

Figure 2:
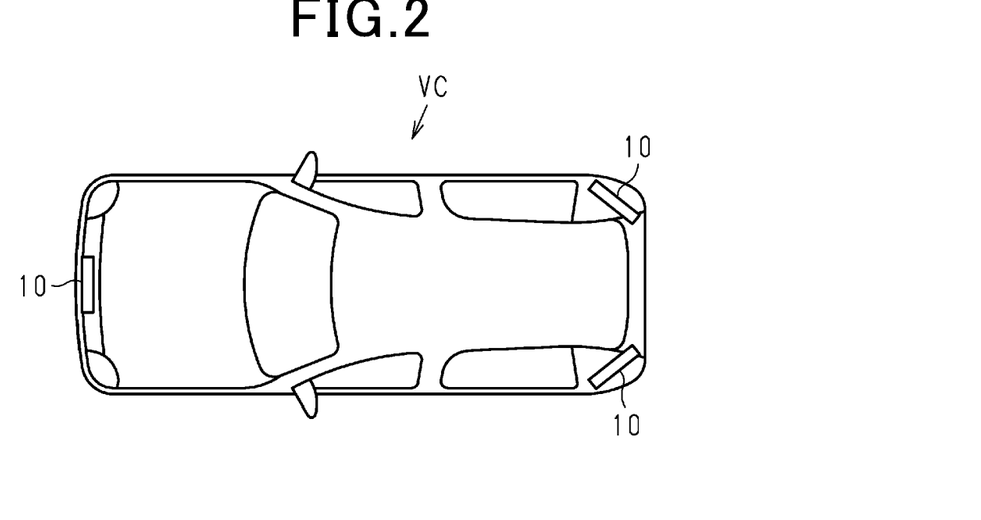
FIG. 2 is a diagram illustrating the arrangement of radar apparatuses according to the embodiment in a vehicle.

FIG. 2 illustrates the arrangement of radar apparatuses 10 in a vehicle VC. In this example, one radar apparatus 10 is arranged at the center of a front portion of the vehicle VC and two radar apparatuses 10 are arranged respectively at the left and right ends of a rear portion of the vehicle VC.

Figure 3:
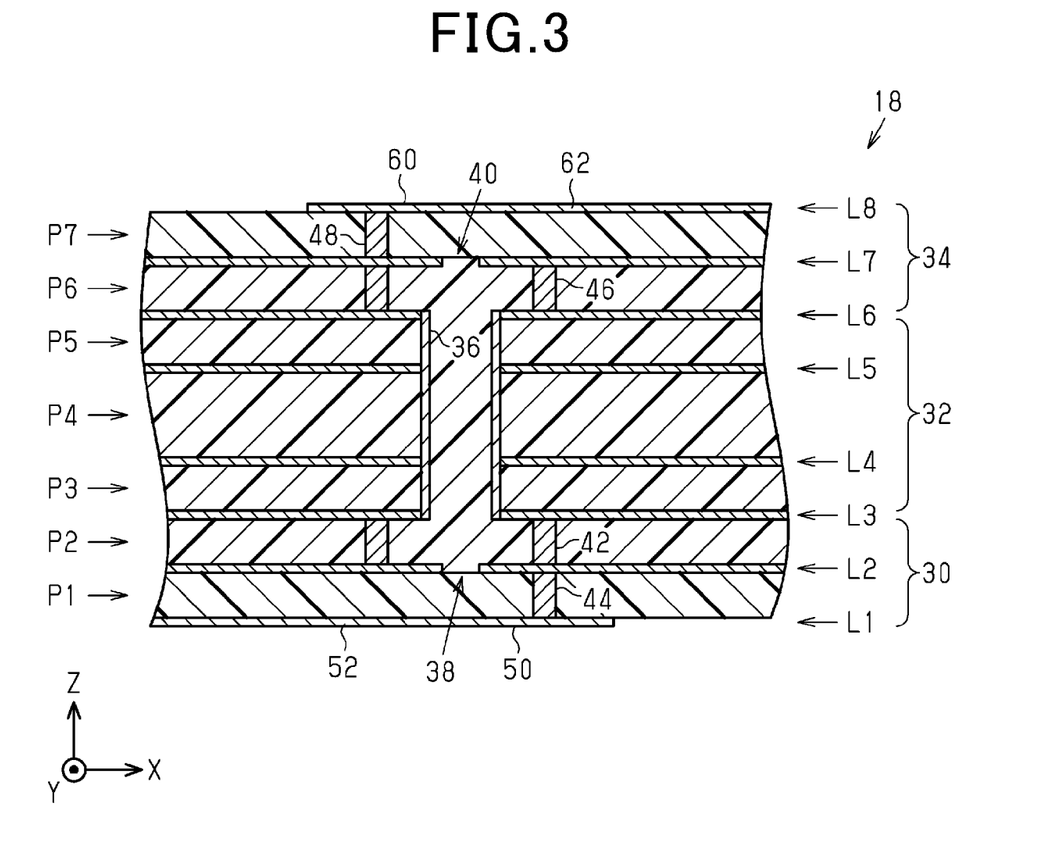
FIG. 3 is a cross-sectional view illustrating the cross-sectional configuration of a double-sided board according to the embodiment.

FIG. 3 illustrates the cross-sectional configuration of the double-sided board 18 according to the present embodiment. The double-sided board 18 is a board in which are sequentially laminated a first conductor layer L1, a first dielectric layer P1, a second conductor layer L2, a second dielectric layer P2, a third conductor layer L3, a third dielectric layer P3, a fourth conductor layer L4, a fourth dielectric layer P4, a fifth conductor layer L5, a fifth dielectric layer P5, a sixth conductor layer L6, a sixth dielectric layer P6, a seventh conductor layer L7, a seventh dielectric layer P7 and an eighth conductor layer L8. One of the first conductor layer L1 and the eighth conductor layer L8 functions as a first-type conductor layer while the other of the two conductor layers L1 and L8 functions as a second-type conductor layer. In addition, as shown in FIG. 3, the lamination direction will be denoted by the Z direction hereinafter. In other words, the direction from either one of the first conductor layer L1 and the eighth conductor layer L8 to the other of the two conductor layers L1 and L8 (or the first direction) will be denoted by the Z direction. In particular, the direction from the first conductor layer L1 to the eighth conductor layer L8 will be denoted by the positive Z direction.

The first dielectric layer P1, the second dielectric layer P2, the third dielectric layer P3, the fourth dielectric layer P4, the fifth dielectric layer P5, the sixth dielectric layer P6 and the seventh dielectric layer P7 are each formed of a resin material. More particularly, in the present embodiment, a glass fabric base epoxy resin is employed as the material of the second dielectric layer P2, the third dielectric layer P3, the fourth dielectric layer P4, the fifth dielectric layer P5 and the sixth dielectric layer P6; and a polyphenylene ether resin is employed as the material of the first dielectric layer P1 and the seventh dielectric layer P7.

Hereinafter, for the sake of convenience, parts of the double-sided board 18 are classified into a first outer layer part 30, an inner layer part 32 and a second outer layer part 34. The first outer layer part 30 includes the first conductor layer L1, the first dielectric layer P1, the second conductor layer L2 and the second dielectric layer P2. The inner layer part 32 includes the third conductor layer L3, the third dielectric layer P3, the fourth conductor layer L4, the fourth dielectric layer P4, the fifth conductor layer L5, the fifth dielectric layer P5 and the sixth conductor layer L6. The second outer layer part 34 includes the sixth dielectric layer P6, the seventh conductor layer L7, the seventh dielectric layer P7 and the eighth conductor layer L8.

In the inner layer part 32, there is provided a waveguide 36 in such a manner as to penetrate the inner layer part 32. Moreover, the third conductor layer L3, the fourth conductor layer L4, the fifth conductor layer L5 and the sixth conductor layer L6, which together constitute the inner layer part 32, are each grounded to form a ground plane.

Figure 4:
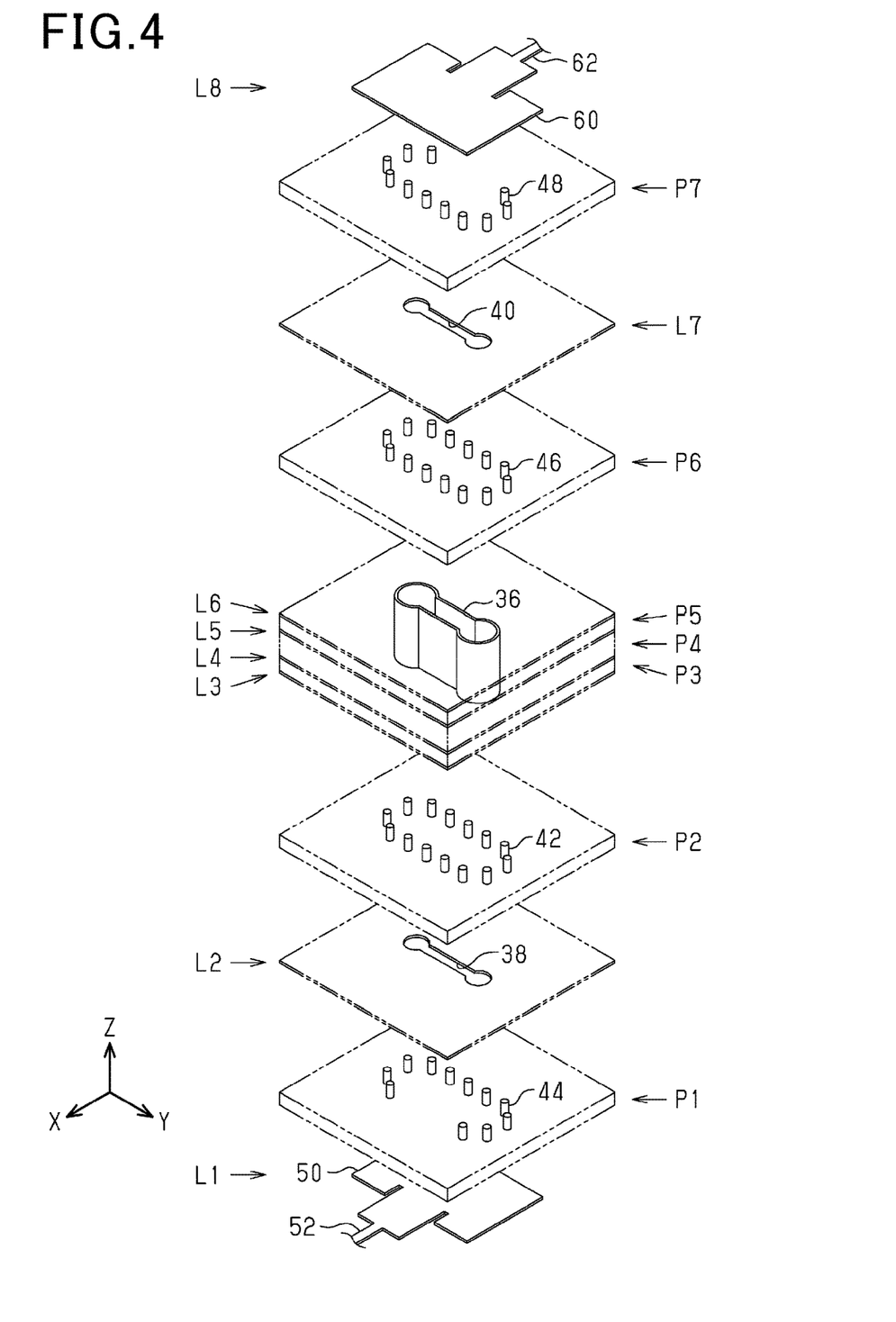
FIG. 4 is an exploded perspective view illustrating the configuration of the double-sided board according to the embodiment.

FIG. 4 shows an exploded perspective view of the double-sided board 18.

As shown in FIG. 4, in the first conductor layer L1, there are formed a microstrip line 52 and a first-side conversion part 50 that converts signals transmitted from either one of the waveguide 36 and the microstrip line 52 to the other of the waveguide 36 and the microstrip line 52.

Figure 5:
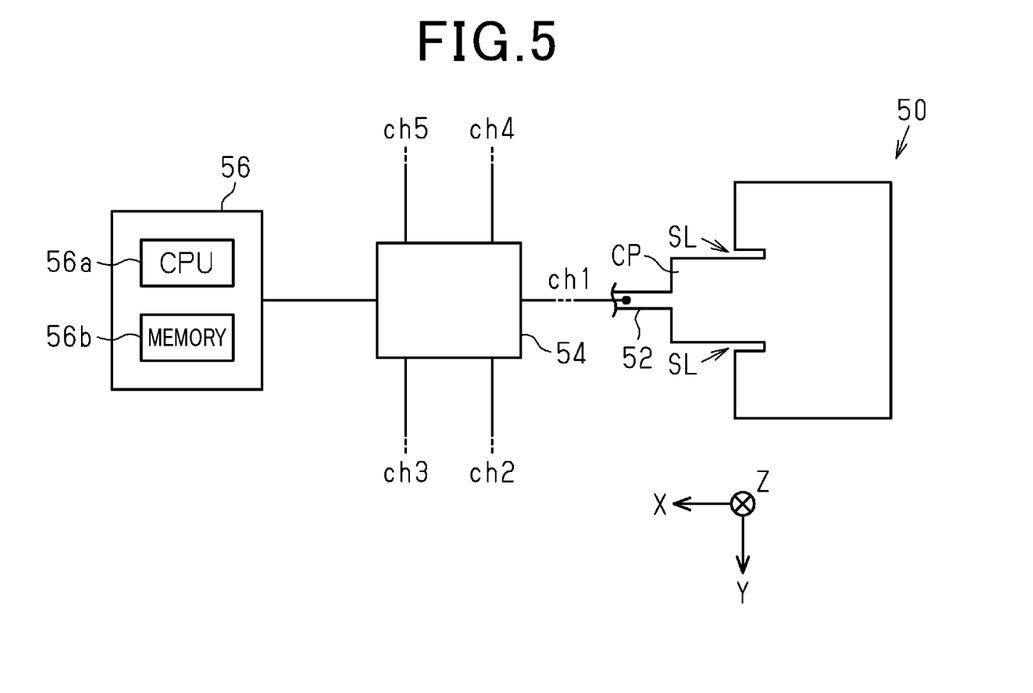
FIG. 5 is a diagram showing a member connected to a first-side conversion part according to the embodiment.

As shown in FIG. 5, in the first-side conversion part 50, there is formed, at a location where the first-side conversion part 50 is connected with the microstrip line 52, a protruding portion CP that has a width larger than the line width of the microstrip line 52. Moreover, a pair of cuts SL are formed respectively at two ends of the protruding portion CP. The protruding portion CP has a function of gently changing the impedance in a connection path between the microstrip line 52 and the first-side conversion part 50. In addition, the function of the cuts SL will be described in detail later. A monolithic microwave integrated circuit (i.e., MMIC 54) is connected to the first-side conversion part 50 via the microstrip line 52.

The MMIC 54 according to the present embodiment includes a 2-channel terminal for transmission and a 3-channel terminal for reception. Therefore, in the first conductor layer L1, there is actually formed an individual first-side conversion part 50 for each of these channels. The first-side conversion part 50 for transmission functions as a member to convert a high-frequency signal from the MMIC 54 into an electromagnetic wave and output the resultant electromagnetic wave to the waveguide 36. Moreover, the first-side conversion part 50 for reception functions as a member to convert an electromagnetic wave from the waveguide 36 into a high-frequency signal and output the resultant high-frequency signal to the microstrip line 52.

The MMIC 54 performs a transmission process of generating a high-frequency signal at 76-77 GHz and transmitting the generated high-frequency signal to the microstrip line 52. Moreover, the MMIC 54 also performs a reception process of receiving a high-frequency signal at 76-77 GHz that is inputted via the microstrip line 52. In addition, the MMIC 54 includes a mixer or the like for synthesizing the high-frequency signal transmitted by the transmission process and the high-frequency signal received by the reception process.

The MMIC 54 is connected with a microcomputer (i.e., microcomputer 56). The microcomputer 56 includes a CPU 56a and a memory 56b. The CPU 56a executes a program stored in the memory 56b. In addition, processes performed by the CPU 56a include a process of controlling both the high-frequency signal transmission process and the high-frequency signal reception process performed by the MMIC 54. Further, the processes performed by the CPU 56a also include: a process of calculating, based on the synthesized signal outputted from the mixer, both the relative distance and the relative speed between the radar apparatus 10 and an object having reflected the high-frequency signal transmitted from the radar apparatus 10; and a process of sending the calculation results to outside of the radar apparatus 10 via the connector 22.

Referring back to FIG. 4, in the eighth conductor layer L8, there are formed an antenna 62 and an eighth-side conversion part 60 that converts signals transmitted from either one of the antenna 62 and the waveguide 36 to the other of the antenna 62 and the waveguide 36.

Figure 6:
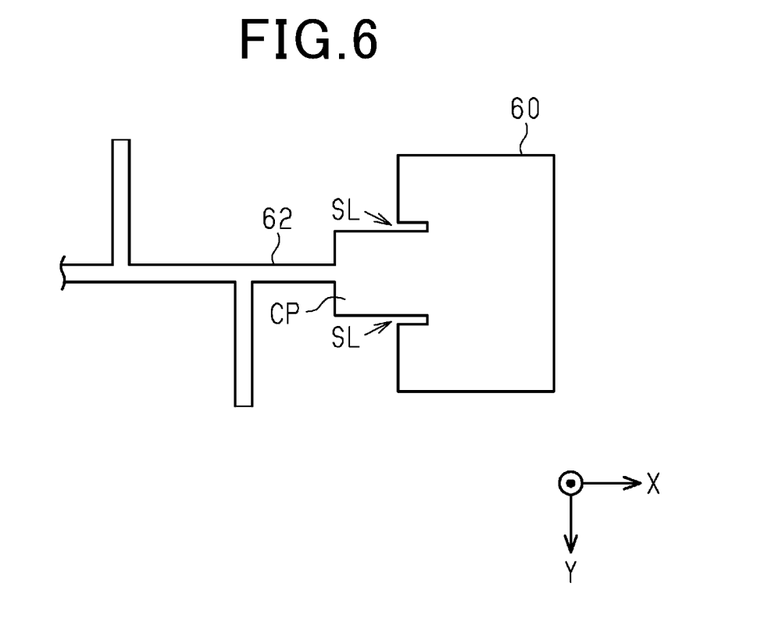
FIG. 6 is a plan view showing an eighth-side conversion part and an antenna according to the embodiment.

As shown in FIG. 6, in the eighth-side conversion part 60, there is formed, at a location where the eighth-side conversion part 60 is connected with the antenna 62, a protruding portion CP that has a width larger than the line width of the microstrip line 52. Moreover, a pair of cuts SL are formed respectively at two ends of the protruding portion CP. The protruding portion CP has a function of gently changing the impedance in a connection path between the antenna 62 and the eighth-side conversion part 60. In addition, the function of the cuts SL will be described in detail later.

As shown in FIGS. 3 and 4, in the second conductor layer L2, there is formed a second-side slit 38. Moreover, in the second dielectric layer P2, there are formed vias 42. Specifically, in the present embodiment, the vias 42 are formed so that a figure resulting from a perpendicular projection of the vias 42 onto a plane including the second conductor layer L2 and perpendicular to the Z direction surrounds the second-side slit 38. In addition, each of the vias 42 extends in the Z direction so as to connect the second conductor layer L2 and the third conductor layer L3. Consequently, the second conductor layer L2 is also grounded to form a ground plane.

In the first dielectric layer P1, there are formed vias 44. Specifically, in the present embodiment, the vias 44 are formed so that a figure resulting from a perpendicular projection of the vias 44 onto a plane including the first conductor layer L1 and perpendicular to the Z direction is located inside and along the edge of the first-side conversion part 50 except in the vicinity of the location where the first-side conversion part 50 is connected with the microstrip line 52. Further, except in the vicinity of the location where the first-side conversion part 50 is connected with the microstrip line 52, the figure resulting from the perpendicular projection of the vias 44 onto the plane including the first conductor layer L1 and perpendicular to the Z direction surrounds a figure resulting from a perpendicular projection of the second-side slit 38 onto the same plane. Such a configuration is for reducing the transmission loss between the microstrip line 52 and the first-side conversion part 50. In particular, in the present embodiment, the figure resulting from the perpendicular projection of the vias 44 onto the plane including the first conductor layer L1 and perpendicular to the Z direction is included neither in the pair of cuts SL nor in the region sandwiched between the pair of cuts SL. In addition, each of the vias 44 extends in the Z direction so as to connect the second conductor layer L2 and the first conductor layer L1.

In the seventh conductor layer L7, there is formed a seventh-side slit 40. Moreover, in the sixth dielectric layer P6, there are formed vias 46. Specifically, in the present embodiment, the vias 46 are formed so that a figure resulting from a perpendicular projection of the vias 46 onto a plane including the seventh conductor layer L7 and perpendicular to the Z direction surrounds the seventh-side slit 40. In addition, each of the vias 46 extends in the Z direction so as to connect the seventh conductor layer L7 and the sixth conductor layer L6. Consequently, the seventh conductor layer L7 is also grounded to form a ground plane.

In the seventh dielectric layer P7, there are formed vias 48. Specifically, in the present embodiment, the vias 48 are formed so that a figure resulting from a perpendicular projection of the vias 48 onto a plane including the eighth conductor layer L8 and perpendicular to the Z direction is located inside and along the edge of the eighth-side conversion part 60 except in the vicinity of the location where the eighth-side conversion part 60 is connected with the antenna 62. Further, except in the vicinity of the location where the eighth-side conversion part 60 is connected with the antenna 62, the figure resulting from the perpendicular projection of the vias 48 onto the plane including the eighth conductor layer L8 and perpendicular to the Z direction surrounds a figure resulting from a perpendicular projection of the seventh-side slit 40 onto the same plane. Such a configuration is for reducing the transmission loss between the eighth-side conversion part 60 and the antenna 62. In particular, in the present embodiment, the figure resulting from the perpendicular projection of the vias 48 onto the plane including the eighth conductor layer L8 and perpendicular to the Z direction is included neither in the pair of cuts SL nor in the region sandwiched between the pair of cuts SL. In addition, each of the vias 48 extends in the Z direction so as to connect the seventh conductor layer L7 and the eighth conductor layer L8.

In the present embodiment, signals to be transmitted by the waveguide 36 are signals in the fundamental mode of the TE modes. This is because it is easier in this case to process the signals as compared with the case where signals in a plurality of modes are to be transmitted.

Figure 7:
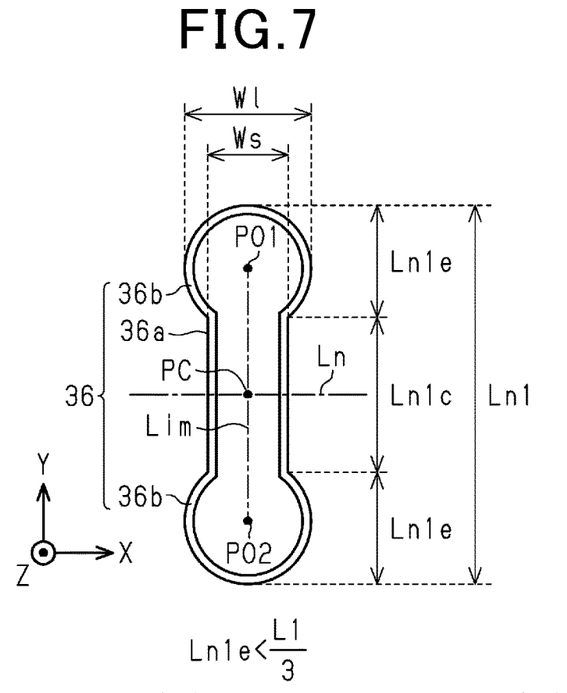
FIG. 7 is a cross-sectional view illustrating the cross-sectional configuration of a waveguide according to the embodiment.

FIG. 7 shows the cross-sectional shape of the waveguide 36 in an X-Y plane which is perpendicular to the Z direction.

As shown in FIG. 7, in the X-Y plane, the waveguide 36 includes a rectangle whose shorter-side direction coincides with the X direction and longer-side direction coincides with the Y direction, and two circles superimposed respectively on two ends of the rectangle in the Y direction. The circles have a diameter corresponding to a length W1; and the length W1 is larger than a shorter-side length Ws of the rectangle. Moreover, a straight line Lim connecting the centers PO1 and PO2 of the two circles extends parallel to the Y direction. In addition, the straight line Lim is located at the center position of the waveguide 36 in the X direction.

Therefore, the cross-sectional shape of the waveguide 36 in the X-Y plane is axisymmetric with respect to the straight line Lim. Moreover, the cross-sectional shape of the waveguide 36 in the X-Y plane is also axisymmetric with respect to a straight line Ln that intersects the straight line Lim at right angles and at the center PC of the straight line Lim between the centers PO1 and PO2 of the two circles. In other words, the cross-sectional shape of the waveguide 36 in the X-Y plane is axisymmetric with respect to both a line parallel to its longitudinal direction and a line parallel to its lateral direction.

Specifically, in the present embodiment, the waveguide 36 has, along the Y direction, a central part 36a and two end parts 36b located respectively on two sides of the central part 36a. Moreover, the length Ln1e of each of the end parts 36b in the Y direction is smaller than ⅓ of the length Ln1 of the entire waveguide 36 in the Y direction. In addition, the end parts 36b are those parts of the waveguide 36 which have a length in the X direction larger than the length Ws.

The above configuration of the waveguide 36 according to the present embodiment is for reducing the transmission loss of signals to be transmitted via the waveguide 36. Hereinafter, the reduction in the transmission loss will be described in detail.

Figure 8A:
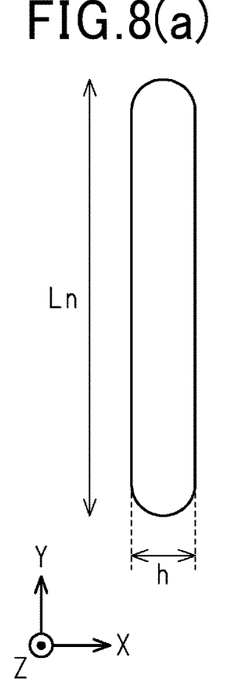
FIGS. 8(a)-8(c) are diagrams for explaining the technical significance of the waveguide according to the embodiment.

FIG. 8(a) shows a waveguide in which the length in the X direction (i.e., the lateral direction of the waveguide) is not increased at both the ends in the Y direction (i.e., the longitudinal direction of the waveguide). This waveguide is similar to a rectangular waveguide. The shape of the outer periphery of the waveguide is determined by boring holes in the board with a drill having a bit diameter slightly smaller than the length h of the waveguide in the X direction. Consequently, the cross-section of the waveguide in an X-Y plane has a semicircular shape at both the ends in the longitudinal direction. In the case of using the waveguide shown in FIG. 8(a), for suppressing the transmission loss within an allowable range, it is necessary to set the length of the waveguide in the longitudinal direction thereof to be larger than the length Ln1 of the waveguide 36 shown in FIG. 7. This is because the cutoff frequency of a rectangular waveguide is inversely proportional to the length of the rectangular waveguide in the longitudinal direction thereof.

As is well known, among all the signals to be transmitted by a rectangular waveguide, signals in the fundamental mode of the TE modes have the lowest cutoff frequency. More specifically, among all the signals which satisfy the boundary condition that the amplitude of the electric field becomes zero at both the ends of the rectangular waveguide in the longitudinal direction thereof, the signals in the fundamental mode of the TE modes are those signals whose electric field wavelength in the Y direction is twice the length of the rectangular waveguide in the longitudinal direction on the inner peripheral surface thereof. In the present embodiment, signals to be transmitted by the rectangular waveguide are set to be in the single mode, thereby simplifying the control. Therefore, it is desirable to set the cutoff frequency for the signals in the single mode to be lower than the operating frequency of 76-77 GHz. On the other hand, the cutoff frequency for the signals in the single mode is inversely proportional to the length of the rectangular waveguide in the longitudinal direction on the inner peripheral surface thereof. Therefore, due to the cutoff frequency, there is a constraint on the minimum value of the length of the rectangular waveguide in the longitudinal direction on the inner peripheral surface thereof; thus there is also a constraint on the minimum value of the length of the rectangular waveguide in the longitudinal direction on the outer peripheral surface thereof.

Strictly speaking, the waveguide shown in FIG. 8(a) is not a rectangular waveguide; however, it can be considered to be substantially equivalent to a rectangular waveguide. Therefore, for transmitting the signals in the fundamental mode of the TE modes at a frequency higher than the cutoff frequency, it is necessary to secure the length of the waveguide in the longitudinal direction on the inner peripheral surface thereof.

Figure 8B:
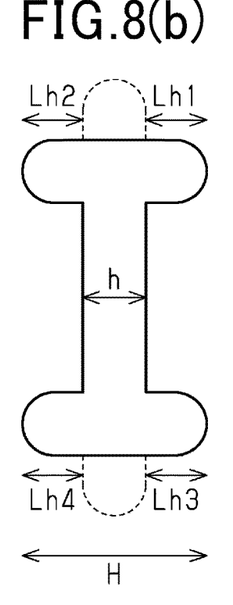

In order to relieve the constraint on the length of a waveguide in the longitudinal direction thereof, the inventors of the present application have investigated a configuration as shown in FIG. 8(b), where the length of the waveguide in the lateral direction thereof is set to be longer at both the end parts of the waveguide in the longitudinal direction than at the central part of the waveguide in the longitudinal direction. That is, the inventors have investigated an H-shape of the waveguide such that the lateral length H of the longitudinal end parts of the waveguide is larger than the lateral length h of the longitudinal central part of the waveguide. More specifically, the inventors have investigated a symmetrical cross-sectional shape of the waveguide such that all the lengths Lh1, Lh2, Lh3 and Lh4 of those portions of the longitudinal end parts of the waveguide which protrude in the positive or negative X direction are equal to each other. In addition, in the waveguide shown in FIG. 8(b), each of the end parts of the waveguide in the Y direction (i.e., the longitudinal direction) has a semicircular shape at both the ends thereof in the X direction (i.e., the lateral direction); this is because the shape of the outer periphery of the waveguide is determined by boring holes in the board with a drill.

Figure 8C:
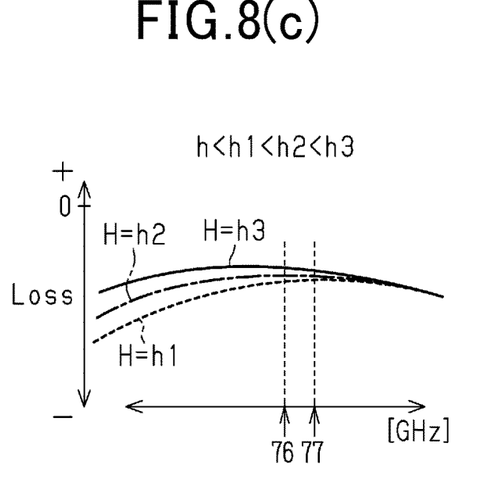

FIG. 8(c) shows change in the transmission loss Loss with change in the lateral length H of the longitudinal end parts of the waveguide shown in FIG. 8(b). The transmission loss Loss is a negative value; therefore, the larger the absolute value thereof, the larger the transmission loss Loss is actually. As shown in FIG. 8(c), the transmission loss Loss at the operating frequency of 76-77 GHz can be reduced by increasing the length H. This is because the cutoff frequency is lowered with increase in the length H.

In addition, in this investigation, the lateral length of the waveguide shown in FIG. 8(a) was not uniformly increased. This is because: uniformly increasing the lateral length of the waveguide shown in FIG. 8(a) is similar to increasing the lateral length of a rectangular waveguide; and it has been theoretically known that increasing the lateral length of a rectangular waveguide does not contribute to the lowering of the cutoff frequency for signals in the aforementioned single mode.

From the results of the investigation shown in FIGS. 8(a)-8(c), it has been found that increasing the lateral length of a waveguide at both the longitudinal end parts of the waveguide is effective for reduction of the transmission loss. In view of the above finding, in the present embodiment, the waveguide 36 having the cross-sectional shape shown in FIG. 7 is employed. That is, a waveguide having the cross-sectional shape shown in FIG. 8(b) is not employed. This is because it is easier to improve the machining accuracy by employing a manufacturing process shown in FIGS. 9(a)-9(d) than by increasing the lateral length of the waveguide at both the longitudinal end parts thereof by using a drill, which is for boring holes of the length h, a plurality of times.

FIGS. 9(a)-9(d) illustrate the manufacturing process of the waveguide 36 according to the present embodiment.

Figure 9A:
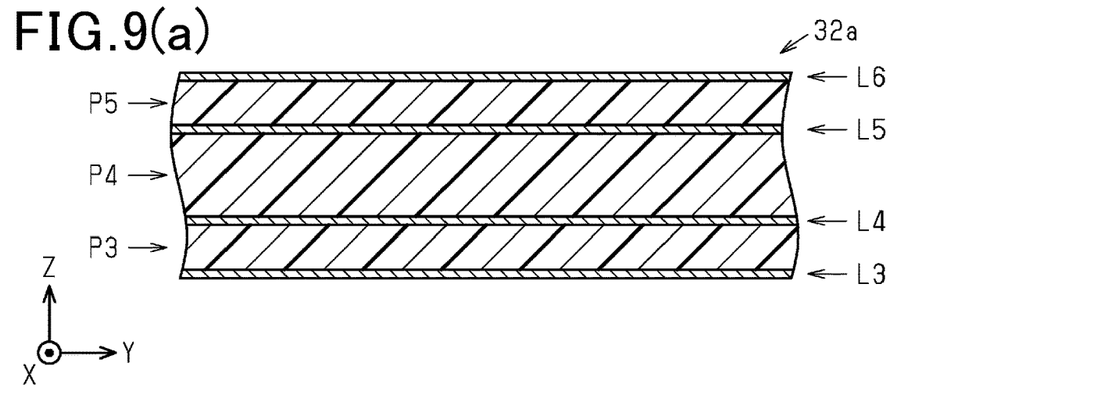
FIGS. 9(a)-9(d) are cross-sectional views illustrating steps for forming the waveguide according to the embodiment.

FIG. 9(a) illustrates the cross-sectional configuration of a prototype member 32a which is a prototype of the inner layer part 32 of the double-sided board 18 according to the present embodiment. The prototype member 32a is formed by laminating the fourth conductor layer L4, the third dielectric layer P3 and the third conductor layer L3 on one side of the fourth dielectric layer P4 and laminating the fifth conductor layer L5, the fifth dielectric layer P5 and the sixth conductor layer L6 on the other side of the fourth dielectric layer P4 in the Z direction.

Figure 9B:
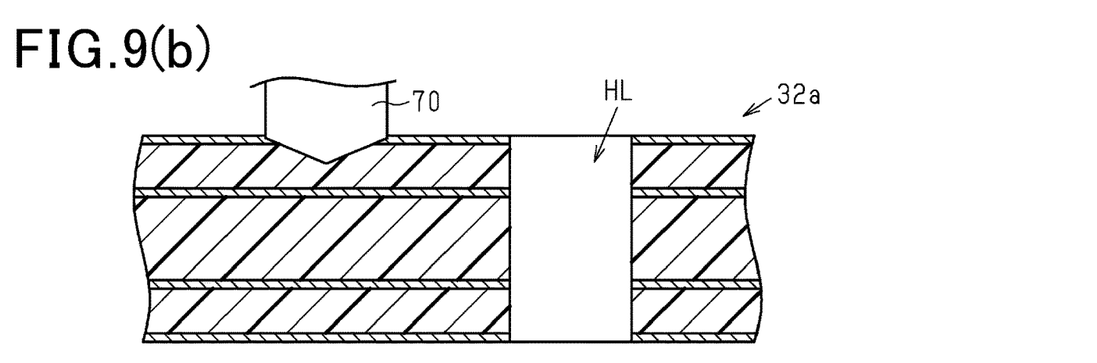

FIG. 9(b) illustrates a step of penetrating, after the lamination step illustrated in FIG. 9(a), the prototype member 32a in the Z direction with a large-bit-diameter drill 70. The large-bit-diameter drill 70 is a drill for boring a hole of the length W1. Specifically, the large-bit-diameter drill 70 has a bit diameter slightly smaller than the length W1. In the present embodiment, a pair of cavities HL are formed in the prototype member 32a by boring a pair of holes with the same large-bit-diameter drill 70 respectively at two locations in the prototype member 32a.

Figure 9C:
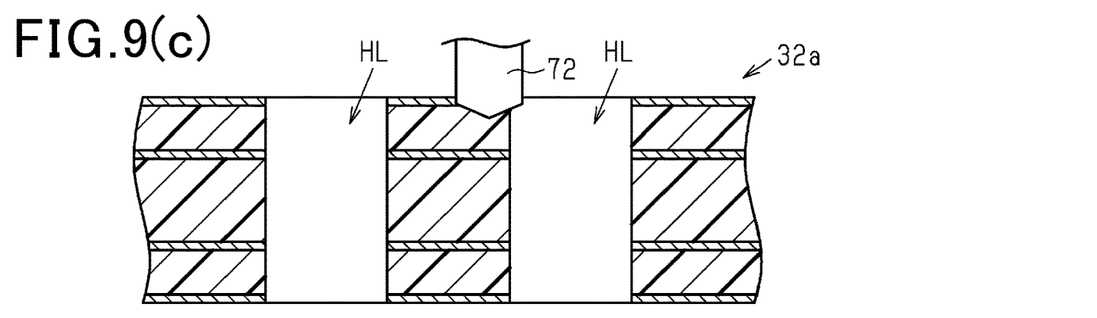

FIG. 9(c) illustrates a step of penetrating, after the penetration step illustrated in FIG. 9(b), the prototype member 32a in the Z direction with a small-bit-diameter drill 72. The small-bit-diameter drill 72 is a drill for boring a hole of the length Ws. Specifically, the small-bit-diameter drill 72 has a bit diameter slightly smaller than the length Ws. In the present embodiment, the prototype member 32a is bored a plurality of times with the small-bit-diameter drill 72 so as to connect the pair of cavities HL formed in the penetration step illustrated in FIG. 9(b).

Figure 9D:
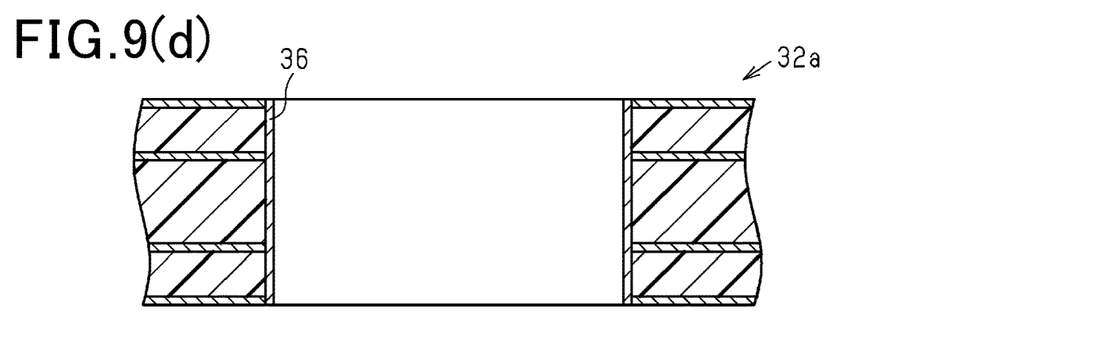

FIG. 9(d) illustrates a step of performing, after the penetration step illustrated in FIG. 9(c), plating on an inner peripheral surface of the prototype member 32a, which defines the cavities formed in the prototype member 32a, and thereby forming the waveguide 36.

As shown in FIGS. 9(a)-9(d), in the present embodiment, the outer peripheral surfaces of both the longitudinal end parts of the waveguide 36 are shaped by penetrating the prototype member 32a with the large-bit-diameter drill 70. In addition, after the plating step illustrated in FIG. 9(d), a dielectric material is filled into the waveguide 36 in a step of laminating the second dielectric layer P2 and the sixth dielectric layer P6.

Figure 10:
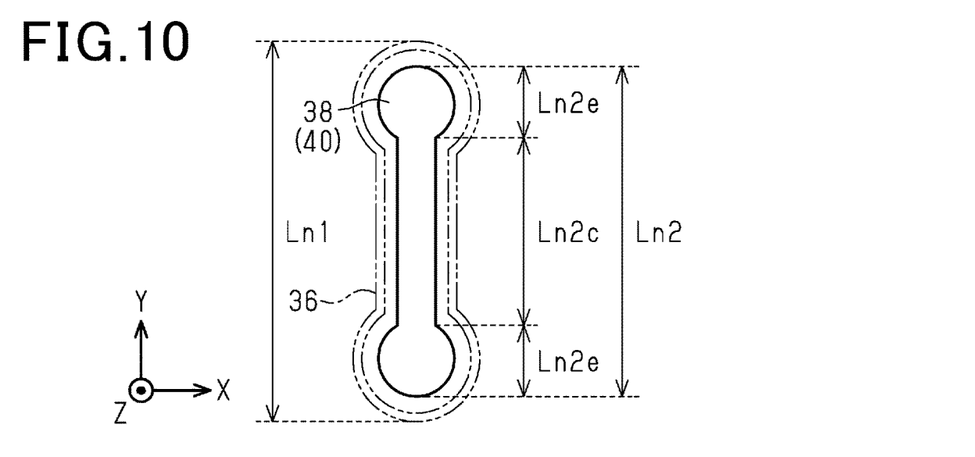
FIG. 10 is a plan view showing the shapes of slits according to the embodiment.

FIG. 10 shows the shapes of the second-side slit 38 and the seventh-side slit 40 in an X-Y plane. In addition, in FIG. 10, there is also shown the cross-sectional shape of the waveguide 36 by dashed lines. That is, FIG. 10 is equivalent to showing figures resulting from perpendicular projections of the waveguide 36 and the second-side slit 38 onto a plane including the first conductor layer L1 and perpendicular to the Z direction. Moreover, FIG. 10 is also equivalent to showing figures resulting from perpendicular projections of the waveguide 36 and the seventh-side slit 40 onto a plane including the eighth conductor layer L8 and perpendicular to the Z direction.

As shown in FIG. 10, in the present embodiment, each of the second-side slit 38 and the seventh-side slit 40 has its lateral length (i.e., length in the X direction) increased at both longitudinal end parts (i.e., end parts in the Y direction) thereof. Specifically, the longitudinal end parts have a larger lateral length than a longitudinal central part of the slit. Moreover, the longitudinal length Ln2e of each of the longitudinal end parts is smaller than ⅓ of the longitudinal length Ln2 of the entire slit.

Furthermore, as shown in FIG. 10, in the present embodiment, figures resulting from perpendicular projections of the second-side slit 38 and the seventh-side slit 40 onto a plane perpendicular to the Z direction and including the first conductor layer L1 or the eighth conductor layer L8 are included within a figure resulting from a perpendicular projection of the waveguide 36 onto the same plane. That is, the longitudinal length Ln2 of each of the second-side slit 38 and the seventh-side slit 40 is smaller than the longitudinal length Ln1 of the waveguide 36. Moreover, the longitudinal length Ln2e of each of the longitudinal end parts of the second-side slit 38 and the seventh-side slit 40 is smaller than the longitudinal length Ln1e of each of the longitudinal end parts of the waveguide 36.

Next, operational effects of the present embodiment will be described.

Figure 11A:
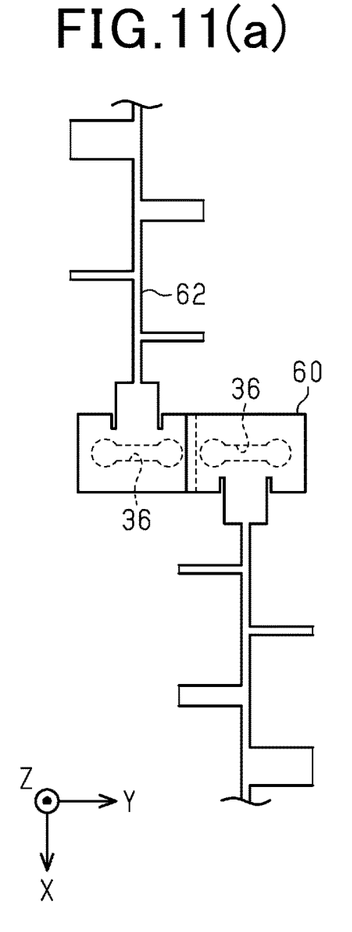
FIG. 11(a) is a diagram illustrating the layout of waveguides according to the embodiment.

FIG. 11(a) illustrates the arrangement of the eighth-side conversion part 60 and the antenna 62. As shown in FIG. 11(a), in the present embodiment, the arrangement space in the Y direction is reduced by arranging the waveguides 36 adjacent to each other in the Y direction.

Figure 11B:
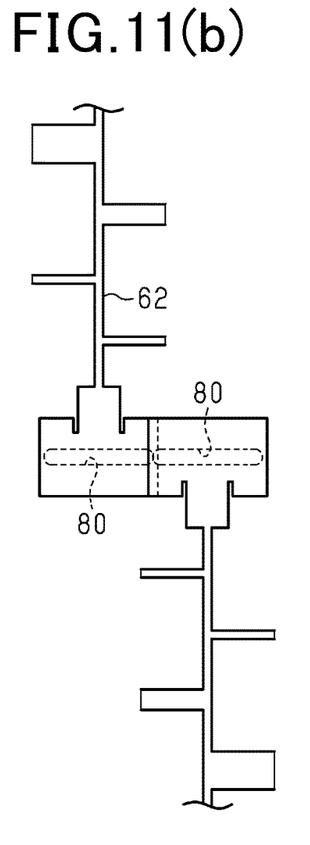
FIGS. 11(b) and 11(c) are diagrams illustrating the layouts of waveguides according to comparative examples.

FIG. 11(b) illustrates a comparative example in which a pair of waveguides 80, which have the cross-sectional shape shown in FIG. 8(a), are arranged in the same manner as the waveguides 36 shown in FIG. 11(a). As shown in FIG. 11(b), in this comparative example, the waveguides 80 may interfere with each other.

Figure 11C:
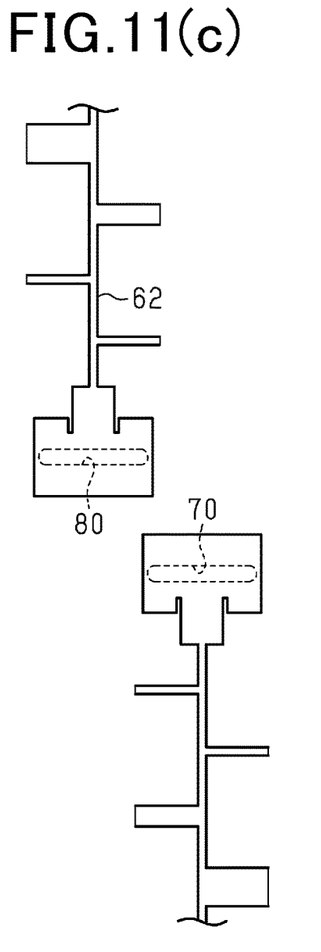

FIG. 11(c) illustrates another comparative example in which a pair of waveguides 80, which have the cross-sectional shape shown in FIG. 8(a), are arranged so as not to interfere with each other. As shown in FIG. 11(c), in this comparative example, a wider arrangement space is required in the X direction as compared with the present embodiment.

As described above, according to the present embodiment, by devising the cross-sectional shape of the waveguide 36, it becomes easy to arrange a plurality of waveguides 36 adjacent to each other in the Y direction. Consequently, it becomes easy to reduce the size of the double-sided board 18.

According to the present embodiment, it is possible to further achieve the following operational effects.

(1) The outer periphery of the waveguide 36 is shaped by: the step of boring a pair of holes in the Z direction respectively at two locations in the prototype member 32a with the large-bit-diameter drill 70 having a larger bit diameter; and the step of boring a hole in the Z direction in the prototype member 32a with the small-bit-diameter drill 72 having a smaller bit diameter. Consequently, it becomes easy to improve the machining accuracy of the waveguide 36 as compared with a waveguide having the cross-sectional shape shown in FIG. 8(b). As a result, it becomes possible to realize the waveguide 36 that has excellent mass productivity.

(2) The step illustrated in FIG. 9(b), which is the step of forming the pair of cavities HL by boring a pair of holes in the Z direction respectively at two locations with the large-bit-diameter drill 70, is performed prior to the step illustrated in FIG. 9(c) which is the step of making, with the small-bit-diameter drill 72, the pair of cavities HL communicate with each other. Consequently, it becomes easy to improve the machining accuracy of the waveguide 36 as compared with the case of performing the two steps in the opposite order.

Figure 12A:
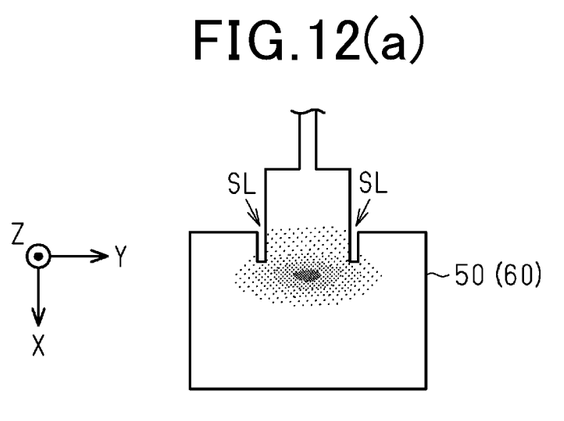
FIGS. 12(a) and 12(b) are plan views respectively showing the electric field distribution according to the embodiment and the electric field distribution according to a comparative example.
Figure 12B:
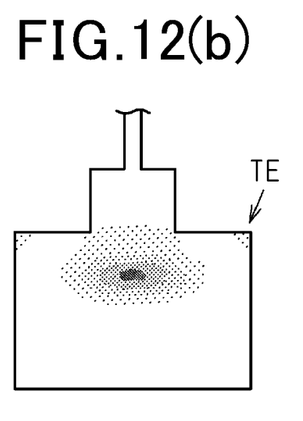

(3) The pair of cuts SL are formed respectively at the two ends of that portion of the first-side conversion part 50 which is connected with the microstrip line 52. Consequently, it becomes possible to prevent electric field concentration as shown by dots in FIG. 12(a) from occurring at both the ends in the Y direction in the microstrip line 52-side end portion of the first-side conversion part 50 in the X direction. As a result, it becomes possible to reduce the electric field loss. In contrast, as shown in FIG. 12(b), in a comparative example where no cuts SL are formed in the first-side conversion part 50, the transmission loss will be increased due to occurrence of electric field concentration at both the ends in the Y direction in the microstrip line 52-side end portion of the first-side conversion part 50 in the X direction.

(4) The first-side conversion part 50 and the second conductor layer L2 are connected by the vias 44. Further, a figure resulting from a perpendicular projection of the vias 44 onto a plane perpendicular to the Z direction and including the first-side conversion part 50 surrounds a figure resulting from a perpendicular projection of the waveguide 36 onto the same plane except in the region sandwiched between the pair of cuts SL formed in the first-side conversion part 50. It is difficult to form the vias 44 in the region where the cuts SL are formed; therefore, forming the cuts SL in the region where it is difficult to form the vias 44, electric field leakage occurring due to the absence of the vias 44 can be compensated.

(5) The pair of cuts SL are formed respectively at the two ends of that portion of the eighth-side conversion part 60 which is connected with the antenna 62. Consequently, it becomes possible to prevent electric field concentration as shown by dots in FIG. 12(a) from occurring at both the ends in the Y direction in the antenna 62-side end portion of the eighth-side conversion part 60 in the X direction. As a result, it becomes possible to reduce the electric field loss. In contrast, as shown in FIG. 12(b), in a comparative example where no cuts SL are formed in eighth-side conversion part 60, the transmission loss will be increased due to occurrence of electric field concentration at both the ends in the Y direction in the antenna 62-side end portion of the eighth-side conversion part 60 in the X direction.

(6) The eighth-side conversion part 60 and the seventh conductor layer L7 are connected by the vias 48. Further, a figure resulting from a perpendicular projection of the vias 48 onto a plane perpendicular to the Z direction and including the eighth-side conversion part 60 surrounds a figure resulting from a perpendicular projection of the waveguide 36 onto the same plane except in the region sandwiched between the pair of cuts SL formed in the eighth-side conversion part 60. It is difficult to form the vias 48 in the region where the cuts SL are formed; therefore, forming the cuts SL in the region where it is difficult to form the vias 48, electric field leakage occurring due to the absence of the vias 48 can be compensated.

(7) A figure resulting from a perpendicular projection of the second-side slit 38 onto a plane perpendicular to the Z direction and including the first conductor layer L1 is included within a figure resulting from a perpendicular projection of the waveguide 36 onto the same plane. With the above configuration, even if positional deviation occurs during the manufacturing process, it is possible to sufficiently suppress the figure resulting from the perpendicular projection of the second-side slit 38 onto the plane perpendicular to the Z direction and including the first conductor layer L1 from protruding outside the figure resulting from the perpendicular projection of the waveguide 36 onto the same plane. Consequently, even if positional deviation occurs during the manufacturing process, it is possible to suppress electric field leakage between the waveguide 36 and the first-side conversion part 50, thereby reducing the transmission loss between the waveguide 36 and the first-side conversion part 50.

(8) The second conductor layer L2 and the third conductor layer L3 are connected by the vias 42. Further, a figure resulting from a perpendicular projection of the vias 42 onto a plane perpendicular to the Z direction and including the first conductor layer L1 surrounds a figure resulting from a perpendicular projection of the waveguide 36 onto the same plane. Consequently, it is possible to suppress electric field leakage between the waveguide 36 and the first-side conversion part 50, thereby reducing the transmission loss between the waveguide 36 and the first-side conversion part 50.

(9) A figure resulting from a perpendicular projection of the seventh-side slit 40 onto a plane perpendicular to the Z direction and including the eighth conductor layer L8 is included within a figure resulting from a perpendicular projection of the waveguide 36 onto the same plane. With the above configuration, even if positional deviation occurs during the manufacturing process, it is possible to sufficiently suppress the figure resulting from the perpendicular projection of the seventh-side slit 40 onto the plane perpendicular to the Z direction and including the eighth conductor layer L8 from protruding outside the figure resulting from the perpendicular projection of the waveguide 36 onto the same plane. Consequently, even if positional deviation occurs during the manufacturing process, it is possible to suppress electric field leakage between the waveguide 36 and the eighth-side conversion part 60, thereby reducing the transmission loss between the waveguide 36 and the eighth-side conversion part 60.

(10) The sixth conductor layer L6 and the seventh conductor layer L7 are connected by the vias 46. Further, a figure resulting from a perpendicular projection of the vias 46 onto a plane perpendicular to the Z direction and including the eighth conductor layer L8 surrounds a figure resulting from a perpendicular projection of the waveguide 36 onto the same plane. Consequently, it is possible to suppress electric field leakage between the waveguide 36 and the eighth-side conversion part 60, thereby reducing the transmission loss between the waveguide 36 and the eighth-side conversion part 60.

The above-described embodiment can be modified and implemented as follows. Moreover, the above-described embodiment and the following modifications can also be implemented in combination with each other to the extent that there is no technical contradiction between them.

Regarding Cross-Sectional Shape of Waveguide

In the above-described embodiment, both the cavities in the longitudinal end parts of the waveguide 36, which define the outer periphery of the waveguide 36, are formed with the same drill so that the longitudinal end parts have the same circular cross-sectional shape. However, the cavities in the longitudinal end parts of the waveguide 36 may alternatively be formed respectively with two drills. In this case, if the two drills had the same specifications, the longitudinal end parts of the waveguide 36 could be formed to have the same circular cross-sectional shape. It should be noted that "the same circular cross-sectional shape" herein allows for tolerances for diameters of the two drills.

In the above-described embodiment, the straight line Lim connecting the centers PO1 and PO2 of the two circles respectively defining the cavities in the longitudinal end parts of the waveguide 36 is parallel to the longitudinal direction under the condition of allowing for manufacturing tolerances. Alternatively, the straight line Lim may intentionally made slightly nonparallel to the longitudinal direction.

In the above-described embodiment, the cross-sectional shape of the waveguide 36 in the X-Y plane includes a rectangle and two circles superimposed respectively on the two longitudinal ends of the rectangle. However, the cross section of the waveguide 36 in the X-Y plane may alternatively have, for example, an H-shape as shown in FIG. 8(b). Even in this case, in order to make clear the difference from a rectangular waveguide whose length in the X direction is increased, it is preferable to set the length of each of the end parts of the H-shaped waveguide in the Y direction to be smaller than ⅓ of the length of the entire H-shaped waveguide in the Y direction.

Moreover, each of the end parts of the H-shaped waveguide in the Y direction may not have a semicircular shape at both the ends thereof in the X direction. For example, the shape of the end parts of the H-shaped waveguide in the Y direction may be made as flat as possible at both the ends thereof in the X direction by forming the cavities in the end parts of the H-shaped waveguide with a drill having a small bit diameter.

Furthermore, the lengths Lh1, Lh2, Lh3 and Lh4 of the end parts of the H-shaped waveguide as shown in FIG. 8(b) are not necessarily set to be all equal to each other. For example, the lengths Lh2 and Lh3 may be set to be equal to each other; the lengths Lh1 and Lh4 may be set to be equal to each other; and the lengths Lh2 and Lh3 may be intentionally set to be larger than the lengths Lh1 and Lh4. It should be noted that "equal to each other" herein allows for manufacturing tolerances.

It is not essential that the extending direction (i.e., the axial direction) of the waveguide 36 is parallel to the Z direction that denotes the lamination direction of the double-sided board 18. That is, the axial direction of the waveguide 36 may be deviated from the Z direction.

Regarding Slits

It is not essential that a figure resulting from a perpendicular projection of the second-side slit 38 onto a plane perpendicular to the Z direction and including the first conductor layer L1 by a light beam parallel to the extending direction (i.e., the axial direction) of the waveguide 36 is included within a figure resulting from a perpendicular projection of the waveguide 36 onto the same plane. For example, the longitudinal ends of the figure resulting from the perpendicular projection of the second-side slit 38 onto the plane may overlap the longitudinal ends of the figure resulting from the perpendicular projection of the waveguide 36 onto the same plane.

The cross-sectional shape of the second-side slit 38 in the X-Y plane is not limited to the shape such that the lateral length of the second-side slit 38 is larger at the longitudinal end parts thereof than at the longitudinal central part thereof.

It is not essential that a figure resulting from a perpendicular projection of the seventh-side slit 40 onto a plane perpendicular to the Z direction and including the eighth conductor layer L8 by a light beam parallel to the extending direction (i.e., the axial direction) of the waveguide 36 is included within a figure resulting from a perpendicular projection of the waveguide 36 onto the same plane. For example, the longitudinal ends of the figure resulting from the perpendicular projection of the seventh-side slit 40 onto the plane may overlap the longitudinal ends of the figure resulting from the perpendicular projection of the waveguide 36 onto the same plane.

The cross-sectional shape of the seventh-side slit 40 in the X-Y plane is not limited to the shape such that the lateral length of the seventh-side slit 40 is larger at the longitudinal end parts thereof than at the longitudinal central part thereof.

In the above-described embodiment, the cross-sectional shapes of the second-side slit 38 and the seventh-side slit 40 are the same. However, the cross-sectional shapes of the second-side slit 38 and the seventh-side slit 40 may alternatively be different from each other. In particular, in the case of the double-sided board 18 being provided with a structural asymmetry, e.g., in the case of the materials of the dielectric layers P1 and P2 sandwiching the second conductor layer L2 therebetween being different from the materials of the dielectric layers P6 and P7 sandwiching the seventh conductor layer L7 therebetween, the cross-sectional shapes of the second-side slit 38 and the seventh-side slit 40 may be intentionally designed to be different from each other.

It is not essential that the second-side slit 38 formed in the second conductor layer L2 is empty. Alternatively, in the second-side slit 38, there may be provided, for example, an electrical conductor in such a manner as not to make contact with the ground plane of the second conductor layer L2.

It is not essential that the seventh-side slit 40 formed in the seventh conductor layer L7 is empty. Alternatively, in the seventh-side slit 40, there may be provided, for example, an electrical conductor in such a manner as not to make contact with the ground plane of the seventh conductor layer L7.

Regarding Conversion Parts

In the above-described embodiment, the protruding portion CP, which is formed at the location where the first-side conversion part 50 is connected with the microstrip line 52, is shaped to have a constant Y-direction length in the X direction. However, the protruding portion CP may alternatively be shaped to have its Y-direction length varying in the X direction. For example, the protruding portion CP may be shaped to have its Y-direction length decreasing in the X direction toward the microstrip line 52. Moreover, it is not essential to form the protruding portion CP in the first-side conversion part 50.

It is not essential to form the cuts SL in the first-side conversion portion 50. For example, in the case of forming the vias 44 in the first dielectric layer P1 without forming the cuts SL in the first-side conversion portion 50, it would still be possible to suppress electric field leakage.

In the above-described embodiment, the protruding portion CP, which is formed at the location where the eighth-side conversion part 60 is connected with the antenna 62, is shaped to have a constant Y-direction length in the X direction. However, the protruding portion CP may alternatively be shaped to have its Y-direction length varying in the X direction. For example, the protruding portion CP may be shaped to have its Y-direction length decreasing in the X direction toward the antenna 62. Moreover, it is not essential to form the protruding portion CP in the eighth-side conversion part 60.

It is not essential to form the cuts SL in the eighth-side conversion part 60. For example, in the case of forming the vias 48 in the seventh dielectric layer P7 without forming the cuts SL in the eighth-side conversion part 60, it would still be possible to suppress electric field leakage.

Regarding Surrounding Conductors

It is not essential that the vias 42 are formed to be in contact with the second conductor layer L2. For example, the vias 42 may alternatively be formed by: laminating the second dielectric layer P2 on the second conductor layer L2; boring holes in the second dielectric layer P2 in such a manner as not to penetrate it; and filling the holes with an electrically conductive material.

It is also not essential that the vias 42 are formed to be in contact with the third conductor layer L3. For example, the vias 42 may alternatively be formed by: laminating the second dielectric layer P2 on the third conductor layer L3; boring holes in the second dielectric layer P2 in such a manner as not to penetrate it; and filling the holes with an electrically conductive material.

Instead of the vias 42, a tubular conductor may be formed as a surrounding conductor by: forming a tubular groove in the second dielectric layer P2; and filling the tubular groove with an electrically conductive material.

For example, in the case where it is difficult to form the vias 42 in the second dielectric layer P2, such as in the case where the first outer layer part 30 is bonded to the inner layer part 32, it is not necessary to provide a surrounding conductor such as the vias 42 in the second dielectric layer P2.

It is not essential that the vias 46 are formed to be in contact with the seventh conductor layer L7.

It is also not essential that the vias 46 are formed to be in contact with the sixth conductor layer L6.

Instead of the vias 46, a tubular conductor may be formed as a surrounding conductor by: forming a tubular groove in the sixth dielectric layer P6; and filling the tubular groove with an electrically conductive material.

For example, in the case where it is difficult to form the vias 46 in the sixth dielectric layer P6, such as in the case where the second outer layer part 34 is bonded to the inner layer part 32, it is not necessary to provide a surrounding conductor such as the vias 46 in the sixth dielectric layer P6.

Regarding Guard Conductors

The vias 44 may not be in contact with the second conductor layer L2.

The vias 44 may also not be in contact with the first-side conversion part 50.

A guard conductor provided in the first dielectric layer P1 is not limited to the vias 44 described above. For example, as a guard conductor, there may be provided, in the first dielectric layer P1, an electrical conductor that has a shape of connecting each adjacent pair of all the vias 44 except for those two vias 44 which are located closest to the location where the first-side conversion part 50 is connected with the microstrip line 52.

It is not essential that a figure resulting from a perpendicular projection of the vias 44 onto a plane perpendicular to the Z direction and including the first conductor layer L1 is included neither in the pair of cuts SL formed in the first-side conversion part 50 nor in the region sandwiched between the pair of cuts SL.

It is not essential to provide a guard conductor such as the vias 44 in the first dielectric layer P1.

The vias 48 may not be in contact with the seventh conductor layer L7.

The vias 48 may also not be in contact with the eighth-side conversion part 60.

A guard conductor provided in the seventh dielectric layer P7 is not limited to the vias 48 described above. For example, as a guard conductor, there may be provided, in the seventh dielectric layer P7, an electrical conductor that has a shape of connecting each adjacent pair of all the vias 48 except for those two vias 48 which are located closest to the location where the eighth-side conversion part 60 is connected with the antenna 62.

It is not essential that a figure resulting from a perpendicular projection of the vias 48 onto a plane perpendicular to the Z direction and including the eighth conductor layer L8 is included neither in the pair of cuts SL formed in the eighth-side conversion part 60 nor in the region sandwiched between the pair of cuts SL.

It is not essential to provide a guard conductor such as the vias 48 in the seventh dielectric layer P7.

Regarding Double-sided Board

For example, the fifth conductor layer L5 may be omitted from the inner layer part 32; and the inner layer part 32 may be constituted of three conductor layers and two dielectric layers. Moreover, for example, both the fourth conductor layer L4 and the fifth conductor layer L5 may be omitted from the inner layer part 32; and the inner layer part 32 may be constituted of two conductor layers and one dielectric layer. Furthermore, for example, all of the third conductor layer L3, the fourth conductor layer L4, the fifth conductor layer L5 and the sixth conductor layer L6 may be omitted from the inner layer part 32; and the waveguide 36 may be embedded in a single dielectric layer.

The second conductor layer L2 may be omitted from the first outer layer part 30; and the first outer layer part 30 may be constituted of one conductor layer and one dielectric layer.

The seventh conductor layer L7 may be omitted from the second outer layer part 34; and the second outer layer part 34 may be constitute of one conductor layer and one dielectric layer.

It is not essential that the inside of the waveguide 36 is filled with a dielectric material.

It is not essential that the microstrip line 52 connecting the first-side conversion part 50 and the MMIC 54 is formed in the first conductor layer L1. For example, the MMIC 54 may be directly connected to the first conversion part 50.

The MMIC 54 is not limited to the configuration in which it is connected only to the first conductor layer L1. For example, one MMIC 54 for transmission may be connected to the first conductor layer L1 while another MMIC 54 for reception may be connected to the eighth conductor layer L8. In other words, with the MMIC 54 for reception connected to the antenna 62, signals received by the antenna 62 may be transmitted to the MMIC 54 without passing through the waveguide 36.

Regarding Manufacturing Process of Waveguide

In the above-described embodiment, the second penetration step of penetrating the prototype member 32a with the small-bit-diameter drill 72 is performed after the first penetration step of penetrating the prototype member 32a with the large-bit-diameter drill 70. However, the order in which the first penetration step and the second penetration step are performed is not limited to the above order.

In the above-described embodiment, the cavities, which define the outer periphery of the waveguide, are formed in the dielectric layers with the drills. However, the cavities may alternatively be formed by other methods, such as a method using a laser.

Regarding Waveguide

In the above-described embodiment, signals to be transmitted by the waveguide, which have a frequency higher than the cutoff frequency, are signals in the fundamental mode of the TE modes. However, signals to be transmitted by the waveguide are not limited to the above signals.

In the above-described embodiment, the waveguide for transmission and the waveguide for reception are separately provided. However, the present disclosure is not limited to this.

Regarding Arrangement of Waveguides

It is not essential to arrange a plurality of waveguides adjacent to each other in the longitudinal direction. Even in cases where a plurality of waveguides are not arranged adjacent to each other in the longitudinal direction, in satisfying various arrangement constraints, it is still effective to reduce the longitudinal length by employing the waveguides illustrated in the above-described embodiment and its modifications. It should be noted that such a situation is the same even when the double-sided board 18 or the radar apparatus 10 includes only a single waveguide.

Regarding Processing Circuit

In the above-described embodiment, the MMIC 54 has a plurality of channels, but the present disclosure is not limited to this. For example, one MMIC may be provided for each of a plurality of channels.

In the above-described embodiment, the MMIC 54 and the microcomputer 56, which controls the transmission/reception processes performed by the MMIC 54 and performs a process of analyzing signals outputted from the MMIC 54, are provided as separated members. However, the MMIC 54 and the microcomputer 56 may alternatively be integrated into a single member.

Regarding Radar Apparatus

The number of antennas 62 for transmission and the number of antennas 62 for reception are not limited to those exemplified in the above-described embodiment. For example, in cases where no phased array process is performed, the radar apparatus may include only one transmitting antenna 62.

The MMIC 54 and the microcomputer 56 are not limited to those mounted on the single double-sided board 18. For example, a double-sided board on which the MMIC 54 is mounted may be different from a board on which the microcomputer 56 is mounted.

The output signals of the radar apparatus are not limited to the detection result signals of the relative speed and distance between the vehicle and an external object. For example, the output signals of the radar apparatus may alternatively be signals to be used for calculating, externally to the radar apparatus, the relative speed and distance between the vehicle and the external object.

The vehicular radar apparatus is not limited to the apparatus that transmits and receives radar waves of 76-77 GHz. For example, it may be an apparatus that transmits and receives radar waves of 76-80 GHz, or be an apparatus that transmits and receives radar waves in the 24 GHz band. Moreover, it is not limited to millimeter-wave radar apparatuses.

OTHERS

The materials of the dielectric layers are not limited to those exemplified in the above-described embodiment.

The materials of the conductor layers are not limited to those exemplified in the above-described embodiment.

While the present disclosure has been described pursuant to the embodiments, it should be appreciated that the present disclosure is not limited to the embodiments and the structures. Instead, the present disclosure encompasses various modifications and changes within equivalent ranges. In addition, various combinations and modes are also included in the category and the scope of technical idea of the present disclosure.

What is claimed is:

1. A double-sided board comprising:
   a first-type conductor layer;
   a second-type conductor layer;
   an intermediate dielectric layer that is a dielectric layer provided between the first-type conductor layer and the second-type conductor layer; and
   a waveguide provided in such a manner as to penetrate the intermediate dielectric layer in a direction from one of the first-type conductor layer and the second-type conductor layer to the other of the first-type conductor layer and the second-type conductor layer,
   wherein:
      a cross section of the waveguide in a plane parallel to the first-type conductor layer has a longitudinal direction and a lateral direction perpendicular to the longitudinal direction,
      the cross section of the waveguide has, along the longitudinal direction, a central part and two end parts located respectively on two sides of the central part, and
      a lateral length of each of the end parts is larger than a lateral length of the central part.

2. The double-sided board as set forth in claim 1, wherein:
   the cross-sectional shape of the waveguide in the plane parallel to the first-type conductor layer includes a rectangle and two circles superimposed respectively on two longitudinal ends of the rectangle, and
   a diameter of each of the circles is larger than a shorter-side length of the rectangle.

3. The double-sided board as set forth in claim 1, wherein in the cross section of the waveguide in the plane parallel to the first-type conductor layer, a longitudinal length of each of the end parts is smaller than 1/3 of a longitudinal length of the entire waveguide.

4. The double-sided board as set forth in claim 1, wherein:
   the waveguide constitutes at least one of a first waveguide and a second waveguide, and
   the first waveguide and the second waveguide are arranged adjacent to each other in the longitudinal direction.

5. The double-sided board as set forth in claim 1, wherein:
   the first-type conductor layer includes a conversion part and a connecting conductor that is an electrical conductor connected with the conversion part,
   the conversion part is an electrical conductor that mediates transmission of electric power between the connecting conductor and the waveguide, and
   the conversion part has a portion connected with the connecting conductor and a pair of cuts formed respectively at two ends of the portion connected with the connecting conductor.

6. The double-sided board as set forth in claim 5, wherein:
   the direction from one of the first-type conductor layer and the second-type conductor layer to the other of the first-type conductor layer and the second-type conductor layer is defined as a first direction,
   the double-sided board further comprises:
      a waveguide-facing dielectric layer that is a dielectric layer covering one of two ends of the waveguide in the first direction which is located closer to the first-type conductor layer than the other of the two ends of the waveguide is;
      a connecting conductor layer that is a conductor layer laminated on a back surface of the waveguide-facing dielectric layer and facing the first-type conductor layer, the back surface of the waveguide-facing dielectric layer being on a back side of a waveguide-facing surface of the waveguide-facing dielectric layer; and
      a connecting dielectric layer that is a dielectric layer sandwiched between the connecting conductor layer and the first-type conductor layer,
   in the connecting dielectric layer, there is provided a guard conductor, and
   a figure resulting from a perpendicular projection of the guard conductor onto a plane perpendicular to the first direction and including the first-type conductor layer is located outside a region sandwiched between the pair of cuts.

7. The double-sided board as set forth in claim 5, wherein the connecting conductor is an antenna.

8. The double-sided board as set forth in claim 5, wherein the second-type conductor layer includes an antenna.

9. The double-sided board as set forth in claim 1, wherein:
   the direction from one of the first-type conductor layer and the second-type conductor layer to the other of the first-type conductor layer and the second-type conductor layer is defined as a first direction,
   the double-sided board further comprises:
      a waveguide-facing dielectric layer that is a dielectric layer covering one of two ends of the waveguide in the first direction which is located closer to the first-type conductor layer than the other of the two ends of the waveguide is;
      a connecting conductor layer that is a conductor layer laminated on a back surface of the waveguide-facing dielectric layer and facing the first-type conductor layer, the back surface of the waveguide-facing dielectric layer being on a back side of a waveguide-facing surface of the waveguide-facing dielectric layer; and
      a connecting dielectric layer that is a dielectric layer sandwiched between the connecting conductor layer and the first-type conductor layer,
   the first-type conductor layer includes a conversion part and a connecting conductor, the conversion part faces the waveguide through the connecting dielectric layer, the connecting conductor layer and the waveguide-facing dielectric layer, the connecting conductor is an electrical conductor connected with the conversion part, the conversion part is an electrical conductor that mediates transmission of electric power between the connecting conductor and the waveguide, in the connecting conductor layer, there is formed a slit facing the conversion part, and a figure resulting from a perpendicular projection of the slit onto a plane perpendicular to the first direction and including the first-type conductor layer is included within a figure resulting from a perpendicular projection of the waveguide onto the plane.

10. The double-sided board as set forth in claim 9, wherein:

in the waveguide-facing dielectric layer, there is provided a surrounding conductor, and a figure resulting from a perpendicular projection of the surrounding conductor onto a plane perpendicular to the first direction and including the connecting conductor layer surrounds the slit.

11. A radar apparatus comprising:

the double-sided board as set forth in claim 1; and a processing circuit configured to perform at least one of a transmission process of a high-frequency signal and a reception process, wherein:

one of the first-type conductor layer and the second-type conductor layer includes an antenna, and the other of the first-type conductor layer and the second-type conductor layer is connected with the processing circuit.

12. The radar apparatus as set forth in claim 11, wherein;

the radar apparatus is configured to be installed in a vehicle, the processing circuit is configured to perform both the transmission process and the reception process, and the reception process is a process of receiving a reflected wave resulting from reflection, by an object present around the vehicle, of the high-frequency signal transmitted by the transmission process.

13. A transmission member comprising the waveguide and the intermediate dielectric layer in the double-sided board as set forth in claim 1.

14. A method of manufacturing the transmission member as set forth in claim 13, the method comprising:

a first penetration step of penetrating the intermediate dielectric layer with a large-bit-diameter drill; and a second penetration step of penetrating the intermediate dielectric layer with a small-bit-diameter drill having a smaller bit diameter than the large-bit-diameter drill, wherein:

in the first penetration step, two cavities respectively corresponding to two end parts of the waveguide are formed in the intermediate dielectric layer, and in the second penetration step, a cavity corresponding to a central part of the waveguide connected with both the end parts is formed in the intermediate dielectric layer.

15. The method as set forth in claim 14, wherein the first penetration step is performed prior to the second penetration step.

* * * * *